US007844867B1

(12) United States Patent
Reddy et al.

(10) Patent No.: US 7,844,867 B1
(45) Date of Patent: Nov. 30, 2010

(54) COMBINED PROCESSOR ACCESS AND BUILT IN SELF TEST IN HIERARCHICAL MEMORY SYSTEMS

(75) Inventors: Sudhakar Reddy, San Jose, CA (US); Gary Depelteau, Ottawa (CA)

(73) Assignee: NetLogic Microsystems, Inc., Santa Clara, CA (US)

( * ) Notice: Subject to any disclaimer, the term of this patent is extended or adjusted under 35 U.S.C. 154(b) by 281 days.

(21) Appl. No.: 11/959,705

(22) Filed: Dec. 19, 2007

(51) Int. Cl.
G11C 29/26 (2006.01)
G11C 29/50 (2006.01)

(52) U.S. Cl. .................... 714/718; 714/733

(58) Field of Classification Search .............. None
See application file for complete search history.

(56) References Cited

U.S. PATENT DOCUMENTS

| | | | |
|---|---|---|---|
| 5,675,545 A * | 10/1997 | Madhavan et al. | 365/201 |
| 6,697,275 B1 | 2/2004 | Sywyk et al. | 365/49 |
| 6,792,500 B1 * | 9/2004 | Herbst | 711/100 |
| 6,870,749 B1 | 3/2005 | Park et al. | 365/49 |
| 6,987,684 B1 | 1/2006 | Branth et al. | 365/49 |
| 7,017,089 B1 | 3/2006 | Huse | 714/713 |
| 7,193,876 B1 | 3/2007 | Park et al. | 365/49 |
| 7,193,877 B1 | 3/2007 | Yelluru | 365/49 |
| 7,304,875 B1 | 12/2007 | Lien et al. | 365/49 |
| 7,343,533 B2 * | 3/2008 | Lee et al. | 714/718 |
| 7,548,105 B2 | 6/2009 | Shrank et al. | 327/156 |
| 2002/0120826 A1 * | 8/2002 | Venkatraman et al. | 711/207 |
| 2006/0218452 A1 * | 9/2006 | Njinda et al. | 714/718 |
| 2007/0271482 A1 | 11/2007 | Doddamane et al. | 714/738 |
| 2007/0294588 A1 * | 12/2007 | Coulson | 714/42 |
| 2008/0016267 A1 * | 1/2008 | Oyaizu | 711/103 |

OTHER PUBLICATIONS

*Joint Test Action Group*, http://en.wikipedia.org/wiki/Joint_Test_Action_Group, pp. 1-4 (last visited Nov. 27, 2007).

* cited by examiner

*Primary Examiner*—Jeffrey A Gaffin
*Assistant Examiner*—Dipakkumar Gandhi
(74) *Attorney, Agent, or Firm*—Mahamedi Paradice Kreisman LLP; William L. Paradice, III (57) ABSTRACT

A hierarchical memory includes a plurality of memory blocks, a common access bus coupled to the plurality of memory blocks, and a host bus interface coupled to the common access bus and configured to provide communication between an external host and the plurality of memory blocks over the common access bus. The memory further includes a Built-In Self Test (BIST) module coupled to the common access bus and configured to communicate with the plurality of memory blocks over the common access bus, and a test access interface coupled to the BIST main module and configured to receive test instructions and test data, to provide the test data to the BIST main module, and to configure the BIST main module in response to the test instructions. BIST operations are carried out in the memory blocks in response to BIST control signals and test data transmitted by the BIST module over the common access bus.

20 Claims, 6 Drawing Sheets

COMBINED PROCESSOR ACCESS AND BUILT IN SELF TEST IN HIERARCHICAL MEMORY SYSTEMS

BACKGROUND

The present invention relates to hierarchical memory systems, and, in particular, to systems and methods for performing built-in self test (BIST) of hierarchical memory systems.

Hierarchical memory systems include multiple memory blocks arranged in a hierarchical topology. Hierarchical memory systems are used in devices, such as search accelerators, in which large amounts of data are to be searched quickly and efficiently. That is, data structures can be stored in hierarchical memories in a manner that enables fast and efficient searching. For example, a b-tree data structure can be efficiently searched when stored in a hierarchical memory, as described in U.S. patent application Ser. No. 11/934,240 filed Nov. 5, 2007 entitled "Integrated Search Engine Devices That Support Efficient Default Route Match Detection And Handle Management In Multi-Way Trees," which is assigned to the assignee of the present invention.

Hierarchical structures are commonly used in content addressable memory (CAM) devices. In many memory devices, such as random access memory (RAM) devices, data is typically accessed by supplying an address to an array of memory cells and then reading data from the memory cells that reside at the supplied address. However, in CAM devices, data within a CAM array is not accessed by initially supplying an address, but rather by initially applying data (e.g., search words) to the array and then performing a search operation to identify one or more entries within the CAM array that contain data equivalent to the applied data and thereby represent a "match" condition: In this manner, data is accessed according to its content rather than its address. Upon completion of the search operation, the identified location(s) containing the equivalent data is typically encoded to provide an address (e.g., block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM array to identify a highest priority matching entry.

An exemplary CAM device that utilizes a priority encoder to identify a highest priority matching entry is disclosed in commonly assigned U.S. Pat. No. 6,370,613 to Diede et al., entitled "Content Addressable Memory with Longest Match Detect." Additional CAM devices are described in U.S. Pat. Nos. 5,706,224, 5,852,569 and 5,964,857 to Srinivasan et al. and in U.S. Pat. Nos. 6,101,116, 6,256,216, 6,128,207 and 6,262,907 to Lien et al., assigned to the present assignee.

In order to verify that the logic circuits of an electronic device, such as the memory blocks of a hierarchical memory, are operating properly, it is desirable to provide test circuitry in the devices. The test circuitry can be used for performing Built-In Self Test (BIST) of the memory devices. In addition, the test circuitry may be designed to permit external testing, such as field testing of an installed memory by a customer.

A standard interface for production and field testing of electronic devices has been defined in Institute of Electrical and Electronic Engineers (IEEE) standard 1149.1: Standard Test Access Port and Boundary Scan Architecture. This standard was developed based on recommendations by the Joint Test Action Group (JTAG), a group of silicon device manufacturers, and is commonly known as the JTAG Boundary Scan Architecture.

The JTAG architecture was designed to provide pin-level access to a logic circuit, providing test circuitry virtual control over the operation of the circuit. In this manner, faults, such as logic faults, memory cell faults, and even fabrication faults, such as cold solder joints and improper wire bond connections, could be discovered and isolated.

Although initially designed for printed circuit boards, the JTAG architecture can be used for accessing sub-blocks of integrated circuits. Moreover, as mentioned above, the JTAG interface can be used as a production testing/debugging tool as well as a field testing tool. When used as a debugging tool, an in-circuit emulator can use the JTAG interface as a transport mechanism, enabling access to an on-chip debug module.

The internal registers of an integrated circuit (IC), such as a memory cell, may be placed on a JTAG boundary scan chain, which allows the combinational logic of the circuit to be field tested after the IC is installed in a production system. When combined with BIST circuitry, the JTAG boundary scan interface enables low overhead, embedded testing of an IC for static faults.

Figure 1:
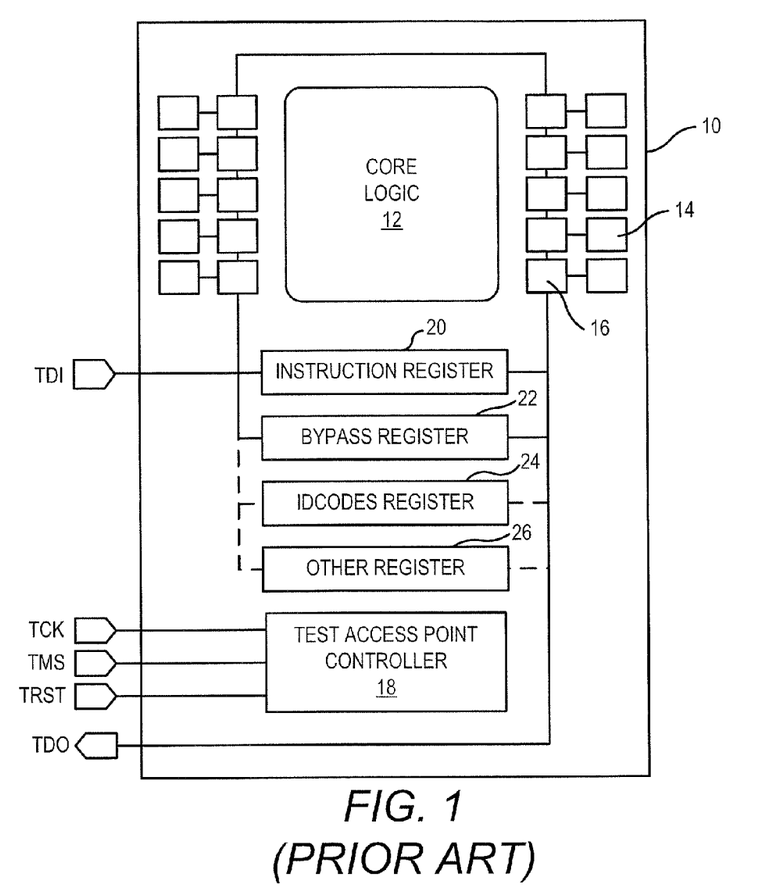
FIG. 1 illustrates a general structure of a JTAG enabled device.

A conventional JTAG-enabled device 10 is illustrated in FIG. 1. As shown therein, the device 10 includes a core logic block 12 that is accessed through a plurality of input/output (I/O) pads or lines 14. A Boundary Scan Register (BSR) including a plurality of boundary scan cells 16 is provided between the core logic block 12 and the I/O pads or lines 14. The boundary scan cells 16 provide pin-level access to the core logic block 12, which permits the test circuitry to read and write data to/from the core logic block 12 at pin level.

That is, the BSR provides a serial scan path that intercepts signals between the core logic block 12 and the I/O pads or lines 14. In normal operation the boundary scan cells 16 are invisible. However, in test mode the boundary scan cells 16 can be used to set and/or read values of the core logic block 12.

The JTAG interface, collectively known as a Test Access Port, or TAP, uses a number of defined signals and registers to support the boundary scan operation. Boundary scan operations are generally controlled by a TAP controller 18, which is a state machine whose transitions are controlled by the TMS ("test mode select") signal. The TCK ("test clock") signal carries the test clock, which synchronizes the internal state machine operations.

The TDI ("test data in") signal represents the test data shifted into the test or programming logic of the device 10. The TDI signal is sampled when the internal state machine is in the correct state. The TDO ("test data out") signal represents the data shifted out of the test or programming logic of the device 10. The TRST ("test reset") signal is an optional signal that is used to reset the state machine of the TAP controller 18.

There are two types of registers associated with boundary scan—instruction registers and data registers. A JTAG-compliant device has one instruction register and two or more data registers.

The instruction register 20 holds the current instruction, which is used by the TAP controller 18 to decide what to do with test signals that are received. Typically, the content of the instruction register 20 identifies the data registers signals to which test signals should be passed.

There are three primary data registers in a JTAG interface: the Boundary Scan Register (BSR), composed of the boundary scan cells 16, a BYPASS register 22 and an IDCODES register 24. Other data registers 26 may be present.

The BSR is the main testing data register, and is used to read/write data to/from the core logic block 12.

The BYPASS register 22 is a single-bit register that causes information to be passed directly from TDI to TDO, allowing other devices/blocks in a circuit to be tested with minimal overhead.

The IDCODES register 24 contains the ID code and revision number for the device. This information allows the device to be linked to its Boundary Scan Description Language (BSDL) file, which contains details of the Boundary Scan configuration for the device.

The IEEE 1149.1 standard further defines a set of instructions for operating the interface. The BYPASS instruction causes the TDI and TDO lines to be connected via a single-bit pass-through register (the BYPASS register 22).

The EXTEST instruction causes the TDI and TDO to be connected to the Boundary Scan Register (BSR). The device's pin states are sampled and new values are shifted into the BSR. These values are then applied to the pins 14.

The SAMPLE/PRELOAD instruction causes the TDI and TDO to be connected to the BSR. However, the device is left in its normal functional mode. During this instruction, the BSR can be accessed by a data scan operation to take a sample of the functional data entering and leaving the device. The instruction is also used to preload test data into the BSR prior to loading an EXTEST instruction.

The INTEST instruction causes the TDI and TDO lines to be connected to the Boundary Scan Register (BSR). While the EXTEST instruction allows the user to set and read pin states, the INTEST instruction relates to the core-logic signals of a device 10.

Figure 2:
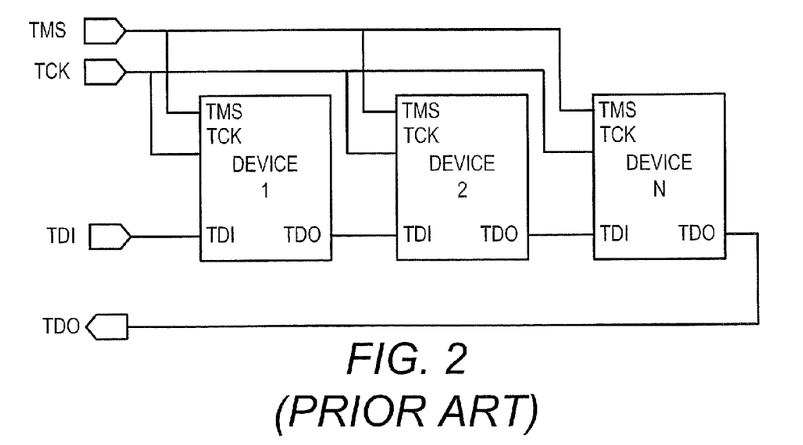
FIG. 2 illustrates a plurality of JTAG enabled devices connected in a daisy chain configuration.

Multiple devices can be connected in a daisy-chain fashion, permitting testing of multiple logic blocks through a single JTAG interface. Referring to FIG. 2, three devices (Device 1, Device 2 and Device N) are connected in a daisy-chain configuration. The devices Device 1 to Device N may represent separate IC chips and/or separate logic blocks of a single IC chip. The TMS and TCK signals are applied in parallel to each of the connected devices. The TDI signal is applied to Device 1, while the TDO signal output by Device 1 is supplied as the TDI signal of Device 2, and so on. While three devices are illustrated in FIG. 2, it will be understood that many more devices may be connected in the chain. In this manner, efficient testing of multiple devices may be accomplished through a single interface, which may be externally accessible to permit field testing of devices.

SUMMARY

A hierarchical memory according to some embodiments includes a plurality of memory blocks, a common access bus coupled to the plurality of memory blocks, and a host bus interface coupled to the common access bus and configured to provide communication between an external host and the plurality of memory blocks over the common access bus. The memory further includes a Built-In Self Test (BIST) main module coupled to the common access bus and configured to communicate with the plurality of memory blocks over the common access bus, and a test access interface coupled to the BIST main module and configured to receive test instructions and test data, to provide the test data to the BIST main module, and to configure the BIST main module in response to the test instructions.

The hierarchical memory may further include a plurality of BIST slave modules in respective ones of the memory blocks. Each of the BIST slave modules may be configured to communicate over the common access bus with the BIST main module and to carry out BIST functions in its associated memory block in response to test data and configuration instructions provided by the BIST main module.

The BIST main module may be configured to communicate with the BIST slave modules using a control signal interface including a write enable signal, a read enable signal, and a read acknowledge signal. The BIST main module may be further configured to communicate with the BIST slave modules using a readback error signal that indicates a readback error in a memory block that is selected to return readback data.

The BIST slave modules may be configured to transmit the readback error signal in response to a readback error encountered during an external BIST operation. The BIST slave modules may be configured to place their associated memory blocks in a test mode upon receipt of a BIST enable signal from the BIST main module.

In some embodiments, the BIST main module may be configured to perform external BIST operations in response to commands written to program input/output (PIO) registers in the hierarchical memory.

The test access interface may include a Joint Test Action Group (JTAG) TAP controller.

Each of the memory blocks may include a control logic circuit configured to interface with the common access bus, and the BIST slave modules may be configured to communicate with the BIST main module through the control logic circuit. In some embodiments, the BIST slave modules may be configured to interface directly to the common access bus.

Some embodiments provide methods of performing Built-In Self Test (BIST) in a hierarchical memory including a plurality of memory blocks, a common access bus coupled to the plurality of memory blocks, a host bus interface coupled to the common access bus and configured to communicate with the plurality of memory blocks over the common access bus and a test access interface that receives test instructions and test data. The methods include receiving the test instructions from the test access interface, and transmitting BIST control signals and test data to one of the plurality of memory blocks over the common access bus in response to the test instructions.

Transmitting BIST control signals and data may include transmitting BIST control signals and test data from a BIST main module to a BIST slave module in the one of the plurality of memory blocks.

The methods may further include executing BIST functions in the BIST slave module in response to the BIST control signals and test data provided by the BIST main module.

The BIST main module may be configured to communicate with the BIST slave modules using a readback error signal that indicates a readback error in a memory block that is selected to return readback data, and the methods may further include transmitting the readback error signal in response to a readback error encountered during an external BIST operation.

The methods may further include placing the one of the plurality of memory blocks in a test mode upon receipt of a BIST enable signal from the BIST main module.

The methods may further include receiving external test instructions through program input/output (PIO) registers in the memory, and transmitting BIST control signals and data to one of the plurality of memory blocks over the common access bus may be performed in response to the external test instructions.

A hierarchical memory according to further embodiments includes a common access bus, a host bus interface coupled to the common access bus and configured to provide communication between an external host and the plurality of memory blocks over the common access bus, and a plurality of memory blocks coupled to the common access bus. Each of the plurality of memory blocks includes a Built-In Self Test (BIST) slave module configured to receive BIST instructions and test data over the common access bus.

The hierarchical memory may further include a test access port configured to receive test instructions and test data, and a BIST main module coupled to the common access bus and configured to communicate with the plurality of memory blocks over the common access bus, to receive test data and configuration instructions from the test access port, and to provide BIST instructions to the BIST slave modules over the common access bus.

The BIST main module may be configured to perform external BIST operations in response to commands written to program input/output (PIO) registers in the hierarchical memory.

Each of the memory blocks may include a control logic circuit configured to interface with the common access bus, and the BIST slave modules may be configured to communicate with the BIST main module through the control logic circuit.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

A hierarchical memory typically includes a plurality of memory blocks that are accessible though a host access bus. Some embodiments of the invention may arise from a recognition that a test interface in an appropriately designed hierarchical memory can take advantage of the existing host access bus as a means for supplying data and/or instructions to a memory block, thus potentially realizing reductions in the amount of silicon required to implement the test interface and/or potentially simplifying the design of the memory.

Figure 3:
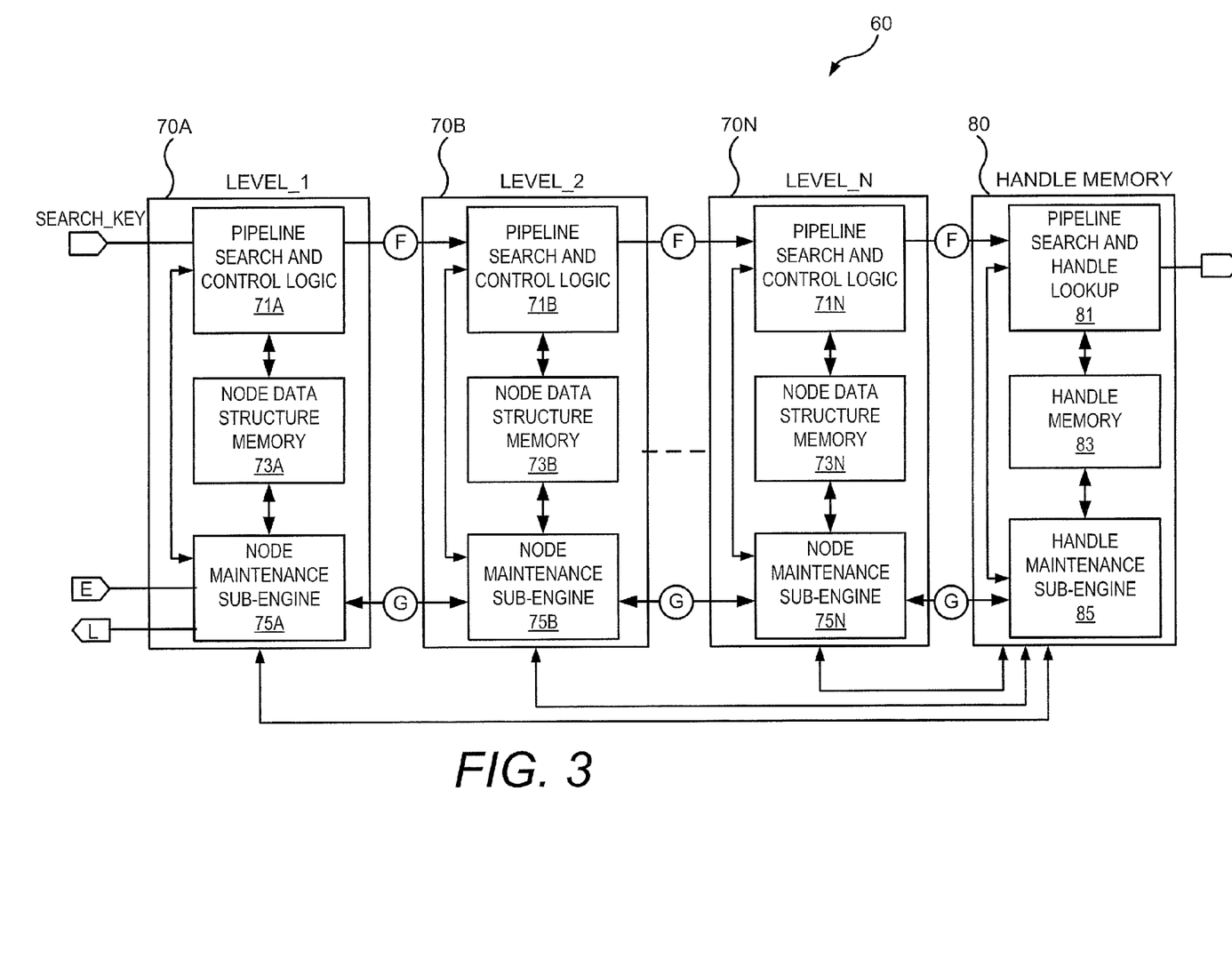
FIG. 3 illustrates a hierarchical memory system.

Referring now to FIG. 3, an exemplary hierarchical memory 60 that may be configured to perform Built In Self Test (BIST) operations according to some embodiments includes a pipelined arrangement of search and tree maintenance sub-engines 70A-70N and a final stage handle memory lookup engine 80 therein. Each of these sub-engines 70A-70N includes a corresponding level of a hierarchical memory therein. Thus, the first search and tree maintenance sub-engine 70A contains the highest level of the hierarchical memory and the third search and tree maintenance sub-engine 70N contains the lowest level of the hierarchical memory. The second search and tree maintenance sub-engine 70B contains an intermediate level of the hierarchical memory. The number of intermediate levels of the hierarchical memory may vary depending on the application to which the search engine 60 is applied. The search and tree maintenance sub-engines 70A-70N are also identified by the reference labels LEVEL_1, LEVEL_2, . . . , LEVEL_N, which identify the memory level supported therein. The reference character "N" represents a positive integer equal to a maximum height of the tree that can be supported by the search engine 60. The hierarchical memory is configured to store a multi-way tree (e.g., b-tree, b*tree, b+tree) of search prefixes that spans the plurality of memory levels. The hierarchical memory is also preferably configured to support increases in a height of the multi-way tree relative to a leaf node level of the multi-way tree, which can be fixed in location at a lowest one of the plurality of memory levels (i.e., LEVEL_N) within the third search and tree maintenance sub-engine 70N. These increases in the height of the multi-way tree typically occur as a capacity of the multi-way tree increases in response to search prefix insertions.

The first search and tree maintenance sub-engine 70A is illustrated as including a first pipeline control and search logic module 71A, which is also referred to herein more generally as a first control module, a first level node memory 73A, which operates as a highest memory level within the hierarchical memory, and a first node maintenance sub-engine 75A. This first level node memory 73A may be provided by row addressable memory, flip-flop memory, or combinations of row addressable and flip-flop memory, for example. The second search and tree maintenance sub-engine 70B is illustrated as including a second pipeline control and search logic module 71B, which is also referred to herein more generally as a second control module, a second level node memory 73B, which operates as a second highest memory level within the hierarchical memory, and a second node maintenance sub-engine 75B. The third search and tree maintenance sub-engine 70N is illustrated as including a third pipeline control and search logic module 71N, which is also referred to herein more generally as a third control module, a third level node memory 73N, which operates as a lowest memory level within the hierarchical memory, and a third node maintenance sub-engine 75N. The first, second and third level node memories 73A-73N may be configured to store search prefixes, span prefix masks and related tree data. These memories are also referred to herein as a node-data-structure memories. The handle memory lookup engine 80 includes a pipeline control and handle lookup logic module 81, a handle memory 83 and a handle maintenance sub-engine 85.

Upon commencement of a search operation, the first control module 71A receives a search valid signal SEARCH_VALID, which initiates a search operation within the search engine 60 when asserted, and a corresponding applied search key SEARCH_KEY[(W−1):0], which is also treated herein more generally as an applied search prefix (e.g., a fully specified search prefix). In response, the first control module 71A may generate a plurality of signals that are passed downstream on an internal interface/bus F to the next highest control module within the pipeline. This next highest control module is illustrated as the second control module 71B. The plurality of signals passed downstream on interface/bus F may include: SEARCH_VALID, SEARCH_KEY[(W−1):0], NEXT_LEVEL[(J−1):0], NEXT_PTR[(P−1):0], MATCH_VALID, BEST_MATCH_LEVEL[(J−1):0], BEST_MATCH_PTR[(P−1):0], BEST_MATCH_KEY_POS[(K−1):0] and BEST_MATCH_KEY_OFFSET[(F−1):0]).

The first node maintenance sub-engine 75A is illustrated as being communicatively coupled to a maintenance request interface E and a maintenance acknowledgment interface L. The maintenance request interface E may be used to pass maintenance instructions (e.g., insert, delete, age, learn, search and learn (SNL)) to the search engine 60 for processing therein and the maintenance acknowledgment interface L may be used to communicate maintenance results and status information back to an issuing host processor (not shown). An interface G extends between the node maintenance sub-engines 75A-75N, as illustrated. The interface G includes a maintenance information interface, which can communicate maintenance information downstream (for inserts and deletes), and a bidirectional "key drop" interface, which supports upstream requests (for prefixes) and downstream transfers of search prefixes between the plurality of levels (LEVEL_1, . . . , LEVEL_L) of the search engine 60. The interface G further includes a child modification interface, which supports upstream transfers of information relating to child nodes associated with a lower memory level. The interface G further includes a bidirectional "key raise" interface, which supports upstream transfers of search prefixes between the plurality of levels of the search engine 60 and downstream transfers of parent acknowledgment information. The Interface G further includes a maintenance "ready" interface, which indicates a ready/non-ready status (done or error). Finally, the interface G includes a handle update interface, which supports handle memory updates within the handle memory lookup engine 80. As illustrated, this interface is coupled to each of the search and tree maintenance sub-engines 70A-70N in the pipeline.

Figure 4:
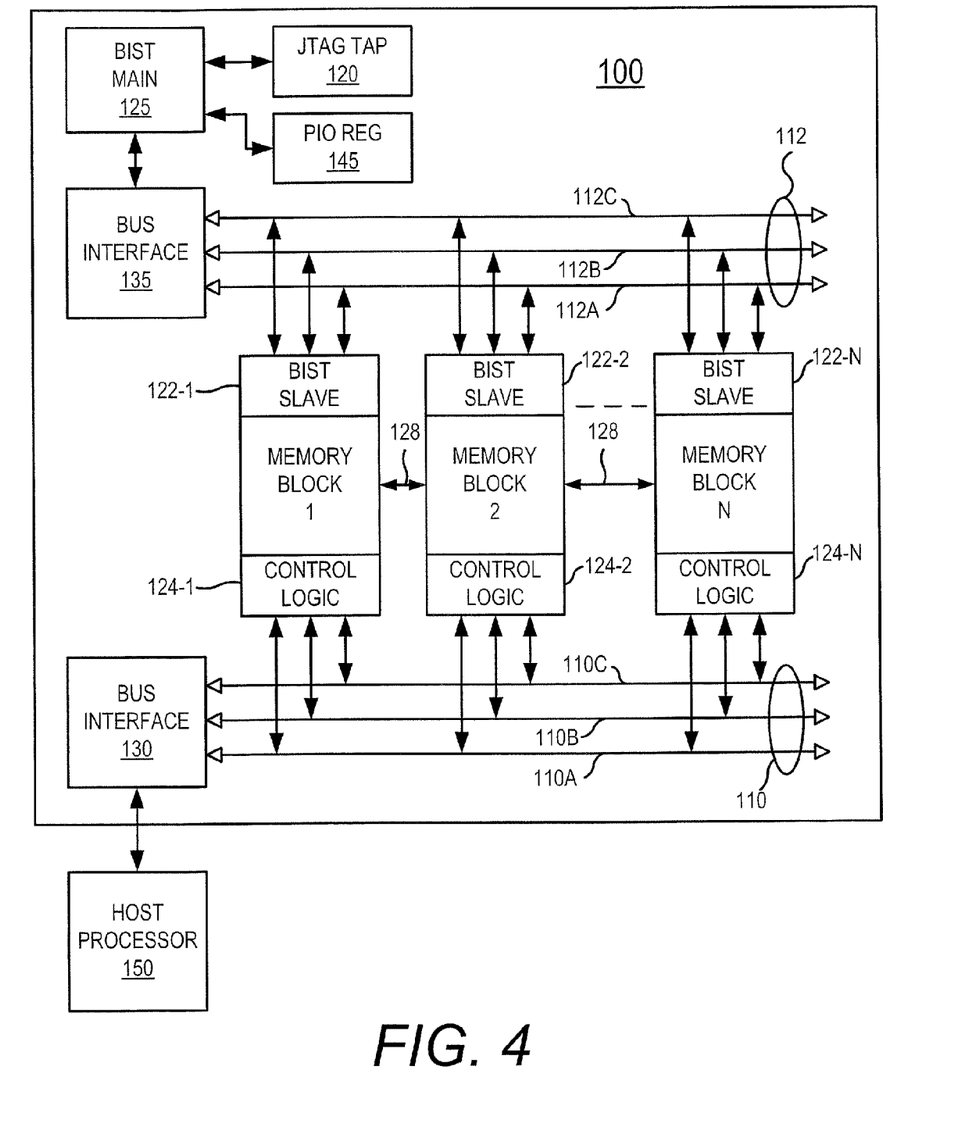
FIGS. 4 and 5 illustrate exemplary hierarchical memory structures including apparatus for performing built-in self test.

FIG. 4 illustrates a structure for a hierarchical memory 100 including exemplary apparatus for performing built-in self test. The hierarchical memory 100 includes a plurality of memory blocks, Memory Block 1 to Memory Block N. Although three memory blocks are illustrated, it will be appreciated that the memory 100 could include more or fewer memory blocks.

Each of the memory blocks communicates with a host processor 150 over a host access bus 110. The host access bus 110 includes three data buses, including an address bus 110A, a read data bus 110B and a write data bus 110C. The host processor 150, which is external to the memory 100, is connected to the host access bus 110 through a bus interface 130. In a typical example, the address bus 110A is a 24-bit wide bus, the read data bus 110B is a 72-bit wide bus and the write data bus 110C is a 36-bit wide bus.

The information flow to/from the memory blocks is controlled by respective I/O control logic circuits 124-1 to 124-N, which interface with the host access bus 110, and which perform address translation, timing, and other functions.

The memory blocks 1 to N may be connected in a pipeline configuration so that data and/or control information can be communicated from block to block over an inter-block interface 128, for example, to implement a hierarchical memory structure as illustrated in FIG. 3.

Built-in self test functionality is provided to the memory structure 100 by a BIST Main module 125, which communicates with the memory blocks 1 to N through a separate BIST access bus 112 via a bus interface 135. The BIST Main module 125 can be implemented in the memory 100 as hardware, software, firmware (e.g. microcode) and/or a combination of hardware, software and/or firmware.

Like the host access bus 110, The BIST access bus 112 includes three data buses, including an address bus 112A, a read data bus 112B and a write data bus 112C. The BIST Main module 125 communicates via the BIST access bus with a plurality of BIST Slave modules 122-1 to 122-N in the respective memory blocks 1 to N. The BIST Slave modules 122-1 to 122-N receive BIST instructions and data from the BIST Main module 125 and carry out bit test procedures in accordance with the BIST instructions. Like the BIST Main module 125, the BIST Slave modules 122-1 to 122-N can be implemented in the architecture of the memory 100 as hardware, software, firmware (e.g. microcode) and/or a combination of hardware, software and/or firmware.

The BIST Main module 125 in turn receives data and configuration instructions through a test interface, such as a JTAG TAP module 120. As discussed above, the JTAG TAP module 120 comprises a state machine whose state is controlled by TMS control signals provided over the JTAG interface. In addition, the BIST functionality can be exploited through direct read/writes to/from program I/O (PIO) registers 145 in the memory 100. That is, the BIST Main module 125 also performs BIST functions in response to data/instructions written to the PIO registers 145.

Separating the BIST Slave modules 122-1 to 122-N from the I/O control logic 124-1 to 124-N may simplify the design of the memory blocks. However, a potential drawback to the topology of the memory structure 100 is that it requires two separate buses, namely, a host access bus 110 and a separate BIST access bus 112, and related interface circuitry. The resulting implementation may consume a relatively large area of semiconductor substrate and may require complex routing and circuitry to realize.

Figure 5:
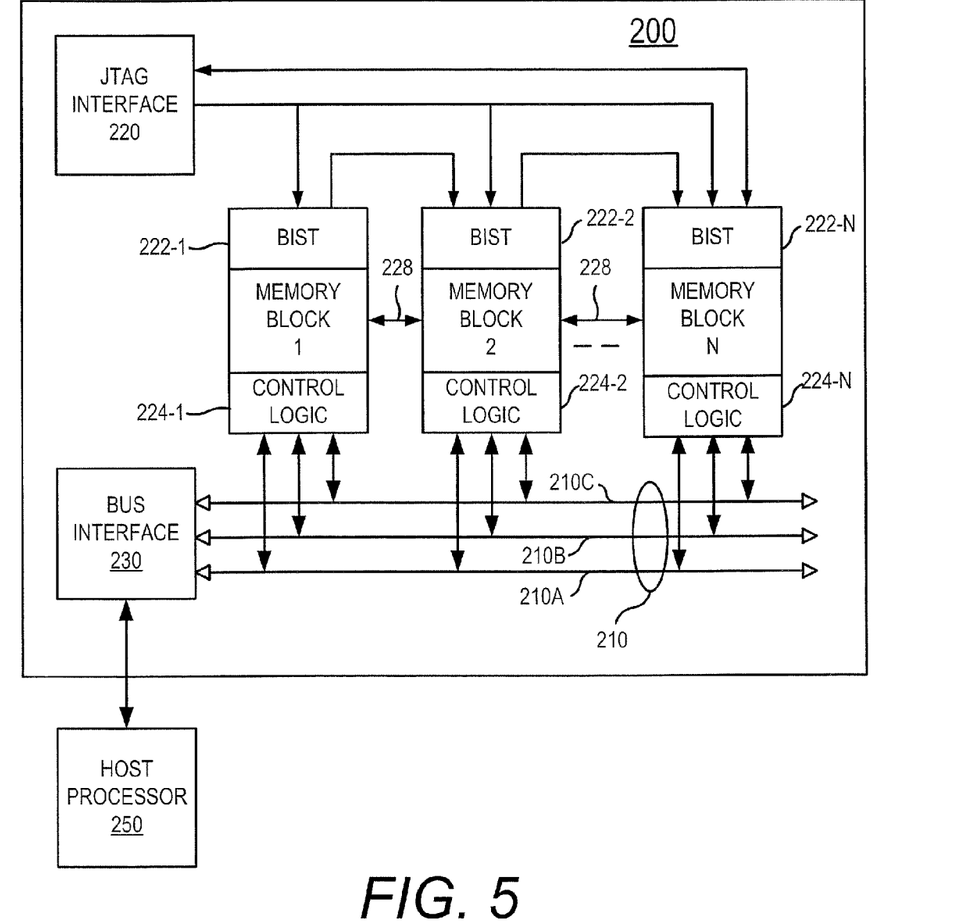

Another example of a hierarchical memory structure 200 including apparatus for performing built-in self test is illustrated in FIG. 5. The hierarchical memory 200 includes a plurality of memory blocks, Memory Block 1 to Memory Block N. Although three memory blocks are illustrated, it will be appreciated that the memory structure 200 could include more or fewer than three memory blocks.

The memory blocks 1 to N may be connected in a pipeline configuration so that data and/or control information can be communicated from block to block over an inter-block interface 228, for example, to implement a hierarchical memory structure as illustrated in FIG. 3.

Each of the memory blocks communicates with a host processor 250 over a host access bus 210. The host access bus 210 includes three data buses, including an address bus 210A, a read data bus 210B and a write data bus 210C. The host processor 250, which is external to the memory structure 200, is connected to the host access bus 210 through a bus interface 230. In a typical example, the address bus 210A is a 24-bit wide bus, the read data bus 210B is a 72-bit wide bus and the write data bus 210C is a 36-bit wide bus.

The information flow to/from the memory blocks is controlled by respective I/O control logic circuits 224-1 to 224-N, which interface with the host access bus 210, and which perform address translation, timing, and other functions.

Built-in self test functionality is provided to the memory structure 200 by BIST modules 222-1 to 222-N in the respective memory blocks 1 to N. The BIST modules 222-1 to 222-N are connected in a daisy-chain configuration so that test data is passed from module to module. Furthermore, the BIST modules 222-1 to 222-N receive timing and state control signals TCK and TMS directly from a JTAG interface 220. Thus, the BIST modules 222-1 and 222-N implement JTAG TAP state machines as well as BIST control logic.

Figure 6:
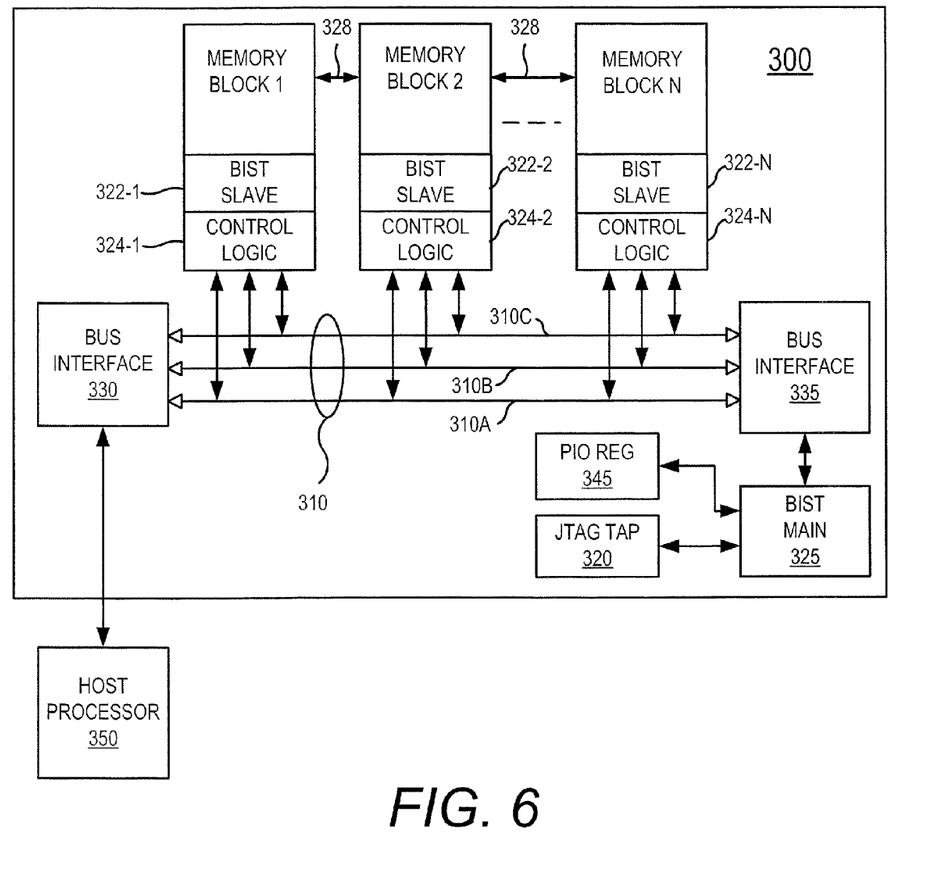
FIG. 6 illustrates a hierarchical memory structure including apparatus for performing built-in self test according to further embodiments.

A hierarchical memory structure 300 according to some embodiments is illustrated in FIG. 6. The memory structure 300 includes a plurality of memory blocks, Memory Block 1 to Memory Block N. Although three memory blocks are illustrated, it will be appreciated that the memory structure 300 could include more or fewer than three memory blocks.

The memory blocks 1 to N may be connected in a pipeline configuration so that data and/or control information can be communicated from block to block over an inter-block interface 328, for example, to implement a hierarchical memory structure as illustrated in FIG. 3.

Each of the memory blocks communicates with a host processor 350 over a common host/BIST access bus ("common access bus") 310. The common access bus 310 includes three data buses, including an address bus 310A, a read data bus 310B and a write data bus 310C. The host processor 350, which is external to the memory structure 300, is connected to the common access bus 310 through a bus interface 330. The address bus 310A may be a 24-bit wide bus, the read data bus 310B may be a 72-bit wide bus and the write data bus 310C may be a 36-bit wide bus.

Built-in self test functionality is provided to the memory structure 300 by a BIST Main module 325, which communicates with the memory blocks 1 to N through the common access bus 310 via a bus interface 335. In some embodiments, separate BIST Main modules are provided for each of the memory blocks and/or for each logic block in the structure 300 that includes BIST functionality. In general, any block that includes SRAM storage devices can include BIST functionality.

In a self-test mode, the BIST Main module 325 communicates via the common access bus 310 with a plurality of BIST Slave modules 322-1 to 322-N in the respective memory blocks 1 to N. The BIST Slave modules 322-1 to 322-N receive BIST instructions and data from the BIST Main module 325 and carry out bit test procedures in accordance with the BIST instructions. The BIST Main module 325 in turn receives data and configuration instructions through a test interface, such as a JTAG TAP module 320. The BIST Main module 325 and the BIST Slave modules 322-1 to 322-N can be implemented in the architecture of the memory 300 as hardware, software, firmware (e.g. microcode) and/or a combination of hardware, software and/or firmware.

As discussed above, the JTAG TAP module 320 comprises a state machine whose state is controlled by TMS control signals provided over the JTAG interface.

The information flow to/from the memory blocks is controlled by respective I/O control logic circuits 324-1 to 324-N, which interface with the common access bus 310, and which perform address translation, timing, and other functions. The BIST Slave modules 322-1 to 322-N interface with the common access bus 310 through the respective I/O control logic circuits 324-1 to 324-N. When a memory block is not in a test mode, data and/or addresses received by the BIST Slave modules 322-1 to 322-N are passed transparently through to the memory blocks 1 to N.

It will be appreciated that the topology illustrated in FIG. 6 is exemplary, and that other configurations for accessing the memory blocks 1 to N through a common access bus 310 are possible. For example, each of the BIST Slave modules 322-1 to 322-N and the control logic circuits 324-1 to 324-N could have a direct access to the common access bus 310, so that data/address information would not pass through the BIST Slave modules in a non-test mode. Alternatively, the BIST Slave modules 322-1 to 322-N could be positioned between the control logic circuits 324-1 to 324-N and the common access bus 310 in some embodiments.

A configuration as illustrated in FIG. 6 may have certain advantages relative to other configurations. Since only a single access bus 310 is used to provide communications between the host processor 350 and the memory blocks 1 to N and between the BIST Main module 325 and the memory blocks 1 to N, the wiring plan of the device may be simplified. Moreover, the topology illustrated in FIG. 6 may consume less semiconductor substrate area, potentially resulting in more efficient use of resources and/or lower manufacturing costs. A memory structure as illustrated in FIG. 6 may also provide faster synchronous operation in a BIST mode, while permitting access to BIST through external registers.

Furthermore, since the BIST Main module can communicate directly with individual BIST Slave modules 322-1 to 322-N via the common bus interface 310, the memory 300 may have considerable flexibility in implementing BIST functionality. For example, the BIST Main module 325 can provide the same or different data to the BIST Slave modules 322-1 to 322-N, and can cause the BIST Slave modules 322-1 to 322-N to execute the same or different tests simultaneously or non-simultaneously. Moreover, since the BIST Main module 325 can provide test data to the BIST Slave modules in parallel, throughput of test data can be increased. In addition, the BIST functionality can be exploited through direct read/writes to/from program I/O (PIO) registers 345 in the memory 300, as well as through the JTAG interface.

In order to use a common access bus 310 instead of separate host and BIST access buses, it is desirable to define an interface including BIST control signals that can be passed over the common access bus 310. For example, in some embodiments, an X interface may be defined including control signals X_WE (write enable), X_RE (read enable) X_RD_ACK (read acknowledge) and X_RD_ERR (read error). The address, read and write data buses can also be defined in the X interface as X_ADDR[23:0]. X_WDATA [35:0] and X_RDATA[71:0].

The JTAG TAP controller 320 controls the BIST function by providing configuration information to the BIST Main module 325. In some embodiments, the BIST function can also be controlled by writes and reads to PIO registers 345.

Once configured, the BIST Main module 325 uses the X interface to communicate with the BIST Slave modules 322-1 to 322-N using pre-defined BIST signals. For example, in some embodiments, the following BIST signals are defined: BIST_EN (BIST enable), BIST_ERROR (BIST error) and BIST_RDBK_ERROR (BIST readback error). The BIST_EN signal is sent to all of the BIST Slave modules 322-1 to 322-N. Upon receipt of a BIST_EN signal, the BIST Slave module places its associated memory block in a test mode in which BIST instructions/commands can be received and processed. If a memory block does not have any of its memory modules enabled, the memory block may enter an idle state upon receipt of the BIST_EN signal.

The BIST_ERROR signal can comprise a dynamic error bit. The BIST_ERROR bit can be configured as a sticky bit for purposes of error reporting.

The BIST_RDBK_ERROR signal is a dynamic error bit that is meaningful when performing external BIST (i.e. BIST that is performed in response to reads/writes to/from PIO registers 345). During external BIST, the BIST_RDBK_ERROR bit comes from the memory that is selected to return it's readback data for presentation.

A BIST configuration according to some embodiments can have all memory blocks under test at the same time, and can report a single Go/NoGo indication at the end of a test sequence. Furthermore, as noted above, an external BIST operation can be enabled. External BIST operates in a similar manner as the normal BIST, except that one 72-bit slice from one of the memories under test can be selected to put its output on an output bus on a cycle by cycle basis along with a few control signals. This provides the ability to pin-point errors down to specific words or bits.

The major tasks of the BIST Main modules are:
  Send configuration information to the BIST Slave modules. This information gets sent over the "X" interface as multiple 36-bit pre-amble words.
  Generate address and control (write and read enables) information for the BIST test sequences. This information consists of fine grain write and read directives sent via the "X" interface.
  Generate the data pattern for the memory Write operations. This information consists of fine grain write and read directives sent via the "X" interface.
  Generate the expected data for Read operations. This information consists of fine grain write and read directives sent via the "X" interface.
  Have the ability to initialize all internal memories.

The major tasks of the BIST Slave modules are:
  Replicate the 36-bit data across the memory width for memory Write operations
  Replicate the 36-bit "write enables" across the memory width for memory Write operations.
  Compare Memory Read results with expected values coming from the 36-bit data bus on the "X" interface. The full memory width can be compared on each memory block in parallel. The expected value coming on the "X" interface is replicated to match the full memory width.
  For External BIST, report Read results for the selected memory via the 72-bit read-back bus. In this mode, only one memory on the chip may be enabled for readback.
  On RMW (read/modify/write) and RMWR (read/modify/write register) operations, loop back the Read Data to be used as Write Data. The loop back data can be either DATA or DATA_BAR.

The BIST Slave modules can receive the following programming information from the BIST Main controller:
  1. A data pattern (36-bits) that is used for the BIST testing. This 36-bit pattern can be replicated to cover the width of the memory being tested. This information is sent over the "X" interface as a 36-bit pre-amble.
  2. Memory enables (one bit per memory block contained in the major logic block) that selectively enable blocks to be tested. This information is sent over the "X" interface as one or two 36-bit pre-ample words.
  3. Bit or Byte Write Enables for each memory block in the module. These 36-bits are replicated to cover the width of the memory being tested. This information is sent over the "X" interface as a 36-bit pre-amble.
  4. A "read-back" select field that specifies which memory is to return Read data for External BIST operations. This information is sent over the "X" interface as part of a 36-bit pre-amble word.
  5. A "read slice" select field that specifies which 72-bit slice to return for External BIST operations. This information is sent over the "X" interface as part of a 36-bit pre-amble word.
  6. Fine grain commands with associated address and data (Write, Read, RMW, RMWR, and Initialize).
  7. A bit that enables a counting pattern (versus the normal simple or checkerboard pattern) to be generated for memory initialization. This feature can be applied to memories that require a counting pattern during initialization. All other memories are initialized to zero.

The BIST Main module(s) communicate with the BIST Slave modules in the major function blocks of the structure 300 that contain SRAM memories. The "X" interface may have the following features:
  1. Single clock cycle writes and reads are implemented.
  2. When BIST is enabled, the "X" interface operates in BIST mode which is different from its normal PIO write/read mode.
  3. The BIST write operation is similar to PIO writes except that these are single clock cycle writes with 36-bit data transmitted where the data gets replicated across the width of the memory under test.
  4. The BIST read operation generates an address for the read. It also generates the expected data. The expected data is carried on the 36-bit "X" interface data bus. The slave controllers replicate this data and compare this expected data with actual data read from the memory under test.
  5. The BIST RMW operations consist of a BIST read as described above, followed by BIST Write operation, except that in this case the data written is the complement of the data read by the BIST read operation. Therefore the requirement for data inversion and loop-back in the target function blocks.
  6. The same idea applies to the BIST RMWR operation except that the write is followed by another read.

In some embodiments, BIST operations may have the following general flow:
  1. The JTAG or the PIO mechanism issue a BIST RESET to all of the Master BIST controllers.

2. The JTAG or the PIO mechanism can load up the BIST control registers.
3. The JTAG or the PIO mechanism sends the BIST_START command to the BIST Main module(s).
4. The BIST Main module(s) generate "X" interface writes to set up the BIST registers in the target slave blocks.
5. BIST operation commences. The JTAG or the PIO mechanism can poll the BIST Main modules for "DONE" status. The "DONE" condition will be indicated when all of the BIST Main modules have completed their operations.
6. BIST operation ends.
7. The JTAG or the PIO mechanism queries the BIST Main module(s) to determine whether errors were encountered during the BIST operations.

It will be appreciated that in embodiments as shown in FIG. 6, any data in any of the memory blocks can be brought into the external I/O bus for debugging together with the dynamic error reporting signal. Thus, faster and/or more flexible debugging can be performed.

Furthermore, the same BIST logic can be used to initialize all of the memory blocks to an initial state, such as a NULL key status. In general, CAM-based memory devices are initialized to NULL key status. Conventional CAM based memories are initialized through external writes. In contrast, a memory system as illustrated in FIG. 6 can be initialized using the BIST logic described above. The initialization can be performed at system start-up and/or in response to program commands.

Figure 7:
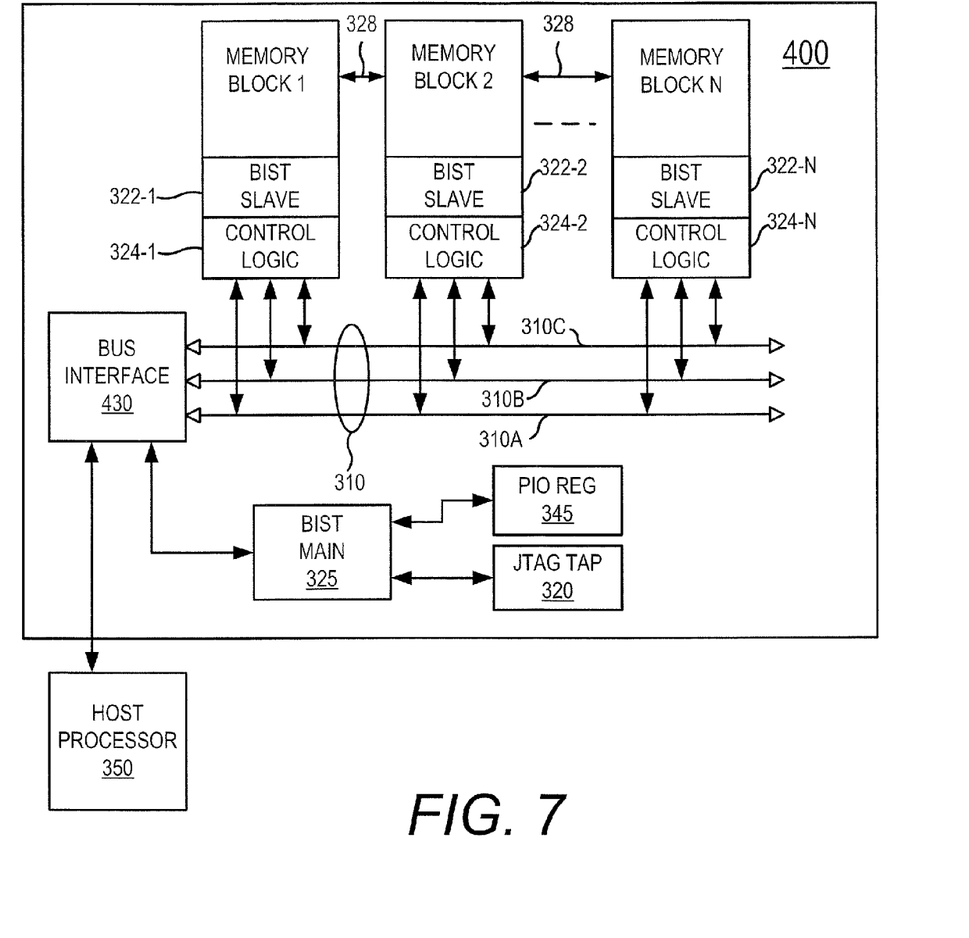
FIG. 7 illustrates a hierarchical memory structure including apparatus for performing built-in self test according to further embodiments.

FIG. 7 illustrates a hierarchical memory structure 400 including apparatus for performing built-in self test according to further embodiments. In the memory structure 400, both the host processor 350 and the BIST Main module 325 access the common access bus 310 through a single bus interface 430. Other elements of the memory structure 400 of FIG. 7 are similar to corresponding elements in the memory structure 300 of FIG. 6 and are not described again.

Although the illustrated embodiments discuss BIST functionality for testing memory cells of a memory block, it will be appreciated that the configurations described herein can be used to test other circuits of a memory block, such as logic and control circuits.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A hierarchical memory, comprising:
    a plurality of memory blocks;
    a common access bus coupled to the plurality of memory blocks;
    a host bus interface coupled to the common access bus and configured to provide communication between an external host and each of the plurality of memory blocks over the common access bus;
    a Built-In Self Test (BIST) main module coupled to the common access bus and configured to communicate with each of the plurality of memory blocks over the common access bus; and
    a test access interface coupled to the BIST main module and configured to:
    receive test instructions and test data;
    provide the test data to the BIST main module; and
    configure the BIST main module in response to the test instructions.

2. The hierarchical memory of claim 1, further comprising:
    a plurality of BIST slave modules in respective ones of the memory blocks, wherein each of the BIST slave modules is configured to communicate over the common access bus with the BIST main module and to carry out BIST functions in its associated memory block in response to test data and configuration instructions provided by the BIST main module.

3. The hierarchical memory of claim 2, wherein the BIST main module is configured to communicate with the BIST slave modules using a control signal interface comprising a write enable signal, a read enable signal, and a read acknowledge signal.

4. The hierarchical memory of claim 2, wherein the BIST main module is further configured to communicate with the BIST slave modules using a readback error signal that indicates a readback error in a memory block that is selected to return readback data.

5. The hierarchical memory of claim 4, wherein the BIST slave modules are configured to transmit the readback error signal in response to a readback error encountered during an external BIST operation.

6. The hierarchical memory of claim 1, wherein the BIST main module is configured to perform external BIST operations in response to commands written to program input/output (PIO) registers in the hierarchical memory.

7. The hierarchical memory of claim 1, wherein the test access interface comprises a Joint Test Action Group (JTAG) TAP controller.

8. The hierarchical memory of claim 1, wherein the BIST slave modules are configured to place their associated memory blocks in a test mode upon receipt of a BIST enable signal from the BIST main module.

9. The hierarchical memory of claim 1, wherein each of the memory blocks comprises a control logic circuit configured to interface with the common access bus, and wherein the BIST slave modules are configured to communicate with the BIST main module through the control logic circuit.

10. The hierarchical memory of claim 1, wherein the BIST slave modules are configured to interface directly to the common access bus.

11. A method of performing Built-In Self Test (BIST) in a hierarchical memory, wherein the hierarchical memory includes a host bus interface coupled to a common access bus and wherein the host bus interface is configured to communicate with a plurality of memory blocks via the common access bus, the method comprising:
    receiving test instructions from a test access interface, wherein the test access interface is coupled to the common access bus and wherein the test access interface is configured to communicate with at least one of the plurality of memory blocks via the common access bus; and
    transmitting BIST control signals and test data to the at least one of the plurality of memory blocks over the common access bus in response to the test instructions.

12. The method of claim 11, wherein transmitting BIST control signals and data comprises transmitting BIST control signals and test data from a BIST main module to a BIST slave module in the one of the plurality of memory blocks.

13. The method of claim 12, further comprising:
    executing BIST functions in the BIST slave module in response to the BIST control signals and test data provided by the BIST main module.

14. The method of claim 13, wherein the BIST main module is configured to communicate with the BIST slave modules using a readback error signal that indicates a readback error in a memory block that is selected to return readback data, the method further comprising transmitting the readback error signal in response to a readback error encountered during an external BIST operation.

15. The method of claim 12, further comprising placing the one of the plurality of memory blocks in a test mode upon receipt of a BIST enable signal from the BIST main module.

16. The method of claim 11, further comprising receiving external test instructions through program input/output (PIO) registers in the memory, wherein transmitting BIST control signals and data to one of the plurality of memory blocks over the common access bus is performed in response to the external test instructions.

17. A hierarchical memory, comprising:
   a common access bus;
   a plurality of memory blocks coupled to the common access bus, wherein each of the plurality of memory blocks coupled to the common access bus includes a Built-In Self Test (BIST) slave module configured to receive BIST instructions and test data over the common access bus; and
   a host bus interface coupled to the common access bus, wherein the host bus interface is configured to provide communication between an external host and a plurality of memory blocks over the common access bus.

18. The hierarchical memory of claim 17, further comprising:
   a test access port configured to receive test instructions and test data; and
   a BIST main module coupled to the common access bus and configured to communicate with the plurality of memory blocks over the common access bus, to receive test data and configuration instructions from the test access port, and to provide BIST instructions to the BIST slave modules over the common access bus.

19. The hierarchical memory of claim 18, wherein the BIST main module is configured to perform external BIST operations in response to commands written to program input/output (PIO) registers in the hierarchical memory.

20. The hierarchical memory of claim 18, wherein each of the memory blocks comprises a control logic circuit configured to interface with the common access bus, and wherein the BIST slave modules are configured to communicate with the BIST main module through the control logic circuit.

* * * * *